United States Patent
Hu et al.

(10) Patent No.: US 11,074,958 B2
(45) Date of Patent: Jul. 27, 2021

(54) MEMORY REFRESH TECHNOLOGY AND COMPUTER SYSTEM

(71) Applicant: HUAWEI TECHNOLOGIES CO., LTD., Guangdong (CN)

(72) Inventors: Xing Hu, Shenzhen (CN); Chuanzeng Liang, Shenzhen (CN); Shihai Xiao, Moscow (RU); Kanwen Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/600,034

(22) Filed: Oct. 11, 2019

(65) Prior Publication Data

US 2020/0066331 A1    Feb. 27, 2020

Related U.S. Application Data

(63) Continuation of application No. PCT/CN2017/080637, filed on Apr. 14, 2017.

(51) Int. Cl.
*G11C 16/04* (2006.01)
*G11C 11/406* (2006.01)

(52) U.S. Cl.
CPC .............. *G11C 11/40618* (2013.01)

(58) Field of Classification Search
CPC .... G11C 11/40618; G11C 16/04; G11C 11/34
USPC .................................................. 365/185.01
See application file for complete search history.

(56) References Cited

U.S. PATENT DOCUMENTS

| | | |
|---|---|---|
| 4,680,704 A | 7/1987 | Konicek et al. |
| 5,557,578 A | 9/1996 | Kelly |
| 6,266,738 B1 | 7/2001 | Kobayashi |
| 7,580,309 B2 | 8/2009 | Yang et al. |
| 8,289,797 B2 | 10/2012 | Jain et al. |

(Continued)

FOREIGN PATENT DOCUMENTS

| | | |
|---|---|---|
| CN | 101000798 A | 7/2007 |
| CN | 101620883 A | 1/2010 |

(Continued)

OTHER PUBLICATIONS

Jamie Liu et al. RAIDR: Retention-Aware Intelligent DRAM Refresh, 2012. total 12 pages.

(Continued)

*Primary Examiner* — Harry W Byrne

(57) ABSTRACT

A memory refresh method is applied to a computer system including a processor, a memory controller, and a dynamic random access memory (DRAM). The memory controller receives a first plurality of access requests from the processor. The memory controller refreshes a first rank in a plurality of ranks at shortened interval set to T/N when a quantity of target ranks to be accessed by the first plurality of access requests is less than a first threshold and a proportion of read requests in the first plurality of access requests or a proportion of write requests in the first plurality of access requests is greater than a second threshold. T is a standard average refresh interval, and N is greater than 1. The memory refresh technology provided in this application can improve performance of the computer system in a memory refresh process.

6 Claims, 5 Drawing Sheets

(56) References Cited

U.S. PATENT DOCUMENTS

| | | | |
|---|---|---|---|
| 8,656,198 B2* | 2/2014 | Branover | ........... G06F 1/3287 |
| | | | 713/323 |
| 8,909,874 B2 | 12/2014 | Brittain et al. | |
| 9,001,608 B1 | 4/2015 | Chishti et al. | |
| 9,196,347 B2 | 11/2015 | Hunter et al. | |
| 9,299,400 B2 | 3/2016 | Bains et al. | |
| 9,384,089 B2 | 7/2016 | Fai | |
| 9,576,637 B1 | 2/2017 | Balakrishnan | |
| 9,685,219 B2 | 6/2017 | Shin | |
| 9,966,129 B1 | 5/2018 | Chen et al. | |
| 10,236,035 B1 | 3/2019 | Lee et al. | |
| 2010/0162020 A1 | 6/2010 | Maule et al. | |
| 2011/0055443 A1 | 3/2011 | Watanabe et al. | |
| 2011/0264934 A1* | 10/2011 | Branover | ........... G06F 1/3287 |
| | | | 713/320 |
| 2012/0144105 A1 | 6/2012 | Dodson et al. | |
| 2012/0144106 A1 | 6/2012 | Bains | |
| 2013/0138878 A1 | 5/2013 | Brittain et al. | |
| 2013/0173858 A1 | 7/2013 | Brittain et al. | |
| 2014/0052938 A1 | 2/2014 | Kim et al. | |
| 2014/0095780 A1 | 4/2014 | Bains et al. | |
| 2014/0334225 A1 | 11/2014 | Cordero et al. | |
| 2015/0149735 A1 | 5/2015 | Nale et al. | |
| 2015/0279441 A1 | 10/2015 | Greenberg et al. | |
| 2015/0294711 A1 | 10/2015 | Gaither et al. | |
| 2017/0091087 A1 | 3/2017 | Cui et al. | |
| 2018/0053569 A1 | 2/2018 | Xiao et al. | |
| 2019/0073161 A1 | 3/2019 | Nale | |

FOREIGN PATENT DOCUMENTS

| | | | |
|---|---|---|---|
| CN | 103019974 A | | 4/2013 |
| CN | 103038754 A | | 4/2013 |
| CN | 104143355 A | | 11/2014 |
| CN | 104488031 A | | 4/2015 |
| CN | 105045722 A | | 11/2015 |
| CN | 105280215 A | | 1/2016 |
| CN | 110520929 A | | 11/2019 |
| GB | 2499053 A | | 8/2013 |
| JP | H0349094 B2 | | 7/1991 |
| JP | H10149311 A | | 6/1998 |
| JP | 2010211864 A | | 9/2010 |
| JP | 2013030246 A | | 2/2013 |
| JP | 2014059831 A | | 4/2014 |
| JP | 2015501999 A | | 1/2015 |
| JP | 2015041395 A | | 3/2015 |
| JP | 2020516988 A | | 6/2020 |
| WO | 2009139109 A1 | | 11/2009 |
| WO | 2013080413 A1 | | 6/2013 |
| WO | 2016176807 A1 | | 11/2016 |

OTHER PUBLICATIONS

Seungjae Baek et al. Refresh Now and Then, IEEE Transactions on Computers, vol. 63, No. 12, Dec. 2014. pp. 3114-3126.

Jeffrey Stuecheli et al. Elastic Refresh: Techniques to Mitigate Refresh Penalties in High Density Memory, 2010 43rd Annual IEEE/ACM International Symposium on Microarchitecture. pp. 375-384.

Cui Zehan et al. Problems and Optimizations of Refresh for Large-Capacity DRAM, Journal of Computer Research and Development , Editorial Office E-mail , Feb. 2016. with partial English translation. Total 17 pages.

Huang Ping et al: "ROP: Alleviating Refresh Overheads via Reviving the Memory System in Frozen Cycles", 2016 45th International Conference on Parallel Processing (ICPP), IEEE, Aug. 16, 2016 (Aug. 16, 2016), pp. 169-178, XP032969642.

* cited by examiner

MEMORY REFRESH TECHNOLOGY AND COMPUTER SYSTEM

CROSS-REFERENCE TO RELATED APPLICATIONS

This application is a continuation of International Application No. PCT/CN2017/080637, filed on Apr. 14, 2017, which is hereby incorporated by reference in its entirety.

TECHNICAL FIELD

This application relates to the field of computer technologies, and in particular, to a memory refresh technology and a computer system.

BACKGROUND

A conventional main memory of a system usually includes a dynamic random access memory (DRAM). A DRAM has a simple structure and a high read speed. The most fundamental storage unit of a DRAM is a DRAM cell, and each DRAM cell includes a transistor and a capacitor. The DRAM cell indicates 0 or 1 by using a quantity of charges in the capacitor. In this manner, one DRAM cell can store one bit. The charges in the capacitor may leak away, and insufficient charges in the capacitor may result in an error in stored data. Therefore, during actual application, the capacitor needs to be periodically charged to retain information stored in the capacitor. This action of charging the capacitor in the DRAM is referred to as a refresh.

DRAM cells in the DRAM are arranged into a matrix. This matrix is referred to as a DRAM bank. Any bit in the DRAM bank can be positioned by using a corresponding row and column decoder. A plurality of DRAM banks may form a DRAM chip, a plurality of DRAM chips may form a DRAM rank, and a plurality of DRAM ranks may be integrated into a dual in-line memory module (DIMM). DRAM cells are refreshed by a sense amplifier (Sense Amp) on a per-row basis. In a refresh process, rows in one or more banks may be refreshed according to a refresh command. During actual application, a refresh is usually performed by using a rank as a unit. Specifically, rows of all banks in the rank need to be refreshed at least once within a retention time. The retention time is a time within which data in a DRAM cell can be retained without a refresh operation.

A person skilled in the art may know that, the double data rate (DDR) protocol specifies three refresh modes: a 1× mode, a 2× mode, and a 4× mode. Different refresh modes have different refresh frequencies, and different refresh frequencies result in different bus utilization rates. Therefore, in a refresh process, refresh mode selection also affects system performance. A method for selecting a refresh mode based on historical execution information is provided in the prior art. In the method, a refresh test is performed once every M time windows. In a test process, a refresh test is performed within N consecutive time windows separately in the 1× mode and the 4× mode. Bus utilization rates during refreshes in the two modes are compared, and a refresh mode with a higher bus utilization rate is selected as a refresh mode for use in next M time windows. Although the refresh mode can be dynamically adjusted with the method, repeated tests waste system performance; in addition, a test result within the N time windows is not quite strongly internally associated with mode selection for the next M windows. Therefore, such a manner cannot effectively reduce refresh overheads or improve system performance.

SUMMARY

This application provides a memory refresh technology and a computer system, so as to reduce a refresh loss of a system, and improve performance of the computer system in a refresh process.

According to a first aspect, this application provides a memory refresh method. The memory refresh method is applied to a computer system including a memory controller and a dynamic random access memory (DRAM), and the DRAM includes a plurality of ranks. In the method, the memory controller receives access requests. The memory controller refreshes a first rank in the plurality of ranks at a T/N interval when a quantity of target ranks of access requests received within a first time period is less than a specified first threshold and a proportion of read requests or write requests in the access requests is greater than a specified second threshold. T is used to indicate a standard average refresh interval, and N is an integer greater than 1.

In the memory refresh method provided in this application, to improve system performance in a memory refresh process, a refresh mode may be dynamically adjusted based on a distribution of the target ranks of the access requests and a status of the proportion of read requests or write requests in the access requests, so that system performance overheads caused by a tFAW limitation can be compensated for by adjusting a refresh frequency, a system bus utilization rate can be improved, and further, system performance in the refresh process can be improved. Moreover, in comparison with the prior art, in the memory refresh method provided in this embodiment of the present invention, the refresh mode can be determined based on a characteristic of the access requests in the current refresh process, so that the determined refresh mode is strongly associated with the refresh process, thereby effectively reducing refresh overheads and improving system performance.

With reference to the first aspect, in a first possible implementation, the method further includes: refreshing, by the memory controller, the first rank at a T interval when a quantity of target ranks of access requests received within a second time period is not less than the specified first threshold or a proportion of read requests or write requests in the access requests is not greater than the specified second threshold.

With reference to the first aspect or the first possible implementation of the first aspect, in a second possible implementation, the method further includes: receiving, by the memory controller in a process of refreshing the first rank, a first access request for accessing the first rank; and buffering, by the memory controller, the first access request in a configured buffer queue, where the memory controller includes at least the buffer queue and a scheduling queue, the buffer queue is configured to buffer an access request for a rank on which a refresh operation is being performed, and the scheduling queue is configured to buffer an access request to be sent to a rank on which a refresh operation is not being performed. In this manner, the access request for the first rank that is received in a process of refreshing the first rank can be prevented from congesting the scheduling queue and from affecting processing, by the memory controller, on an access request for another rank. Processing efficiency of the entire computer system is further improved.

With reference to the second possible implementation of the first aspect, in a third possible implementation, the method further includes: receiving, by the memory controller, a second access request for accessing a second rank in the DRAM; and buffering, by the memory controller, the second access request in the scheduling queue when no refresh operation is being performed on the second rank.

With reference to any one of the first aspect or the first to the third possible implementations of the first aspect, in a fourth possible implementation, the refreshing, by the memory controller, a first rank in the plurality of ranks at a T/N interval includes: refreshing, by the memory controller, the first rank at the T/N interval when a quantity of the access requests received within the first time period is greater than a third threshold and a quantity of access requests for accessing the first rank that are in the received access requests is less than a fourth threshold. Within the first time period, the quantity of the access requests for accessing the first rank is greater than 0.

In the memory refresh method provided in this application, to further mitigate impact caused on performance of the computer system by the memory refresh process, both a status of the received access requests and a status of a to-be-accessed target rank are comprehensively considered for determining whether the target rank needs to be refreshed. In this manner, the first rank can be actively refreshed even if the first rank cannot be in an idle state. Therefore, when access traffic is relatively heavy, the first rank can be refreshed in time even if the first rank cannot be in an idle state. Impact caused on performance of the computer system by a passive refresh generated due to a refresh postponement is mitigated, and memory refresh flexibility is improved. Therefore, system performance can be improved, and refresh overheads can be reduced.

With reference to any one of the first aspect or the first to the third possible implementations of the first aspect, in a fifth possible implementation, the refreshing, by the memory controller, a first rank in the plurality of ranks at a T/N interval includes: refreshing, by the memory controller, the first rank in the plurality of ranks at the T/N interval when a quantity of access requests for accessing the first rank that are in the received access requests within the first time period is not less than a fourth threshold and a quantity of postponed refreshes on the first rank is greater than a specified fifth threshold, where the fifth threshold is less than a specified warning value, and the warning value is used to indicate a need to immediately perform a refresh operation on the first rank.

With reference to any one of the first aspect or the first to the third possible implementations of the first aspect, in a sixth possible implementation, the refreshing a first rank in the plurality of ranks at a T/N interval includes: refreshing, by the memory controller, the first rank in the plurality of ranks at the T/N interval when a quantity of the access requests received within the first time period is not greater than a specified third threshold, a quantity of access requests for the first rank is greater than 0, and a quantity of postponed refreshes on the first rank is greater than a specified fifth threshold, where the fifth threshold is less than a specified warning value, and the warning value is used to indicate a need to immediately perform a refresh operation on the first rank.

According to a second aspect, this application provides a computer system. The computer system includes a memory controller and a dynamic random access memory DRAM connected to the memory controller, and the DRAM includes a plurality of ranks. The memory controller is configured to implement the method described in any one of the first aspect or the possible implementations of the first aspect.

According to a third aspect, this application provides a memory controller. The memory controller includes a communications interface and a refresh circuit. The communications interface is configured to receive access requests sent by a processor in a computer system. The refresh circuit is configured to refresh a first rank in a plurality of ranks of a dynamic random access memory (DRAM) at a T/N interval when a quantity of target ranks of access requests received within a first time period is less than a specified first threshold and a proportion of read requests or write requests in the access requests is greater than a specified second threshold. T is used to indicate a standard average refresh interval, and N is an integer greater than 1.

With reference to the third aspect, in a first possible implementation, the refresh circuit is further configured to refresh the first rank at a T interval when a quantity of target ranks of access requests received within a second time period is not less than the specified first threshold or a proportion of read requests or write requests in the access requests is not greater than the specified second threshold.

With reference to the third aspect and the first possible implementation of the third aspect, in a second possible implementation, the communications interface is further configured to receive, in a process of refreshing the first rank, a first access request for accessing the first rank. The memory controller further includes a buffer. The buffer is configured to buffer the first access request in a configured buffer queue. The buffer includes at least the buffer queue and a scheduling queue. The buffer queue is configured to buffer an access request for a rank on which a refresh operation is being performed, and the scheduling queue is configured to buffer an access request to be sent to a rank on which a refresh operation is not being performed.

With reference to the second possible implementation of the third aspect, in a third possible implementation, the communications interface is further configured to receive a second access request for accessing a second rank in the DRAM. The buffer is further configured to buffer the second access request in the scheduling queue when no refresh operation is being performed on the second rank.

With reference to any one of the third aspect or the first to the third implementations of the third aspect, in a fourth possible implementation, the refresh circuit is specifically configured to: refresh the first rank at the T/N interval when a quantity of the access requests received within the first time period is greater than a third threshold and a quantity of access requests for accessing the first rank that are in the received access requests is less than a fourth threshold, where within the first time period, the quantity of the access requests for accessing the first rank is greater than 0.

With reference to any one of the third aspect or the first to the third possible implementations of the third aspect, in a fifth possible implementation, the refresh circuit is specifically configured to: refresh the first rank in the plurality of ranks at the T/N interval when a quantity of access requests for accessing the first rank that are in the received access requests within the first time period is not less than a fourth threshold and a quantity of postponed refreshes on the first rank is greater than a specified fifth threshold, where the fifth threshold is less than a specified warning value, and the warning value is used to indicate a need to immediately perform a refresh operation on the first rank.

With reference to any one of the third aspect or the first to the third possible implementations of the third aspect, in a sixth possible implementation, the refresh circuit is specifically configured to:

refresh the first rank in the plurality of ranks at the T/N interval when a quantity of the access requests received within the first time period is not greater than a specified third threshold, a quantity of access requests for the first rank is greater than 0, and a quantity of postponed refreshes on the first rank is greater than a specified fifth threshold, where the fifth threshold is less than a specified warning value, and the warning value is used to indicate a need to immediately perform a refresh operation on the first rank.

According to a fourth aspect, this application provides a memory refresh apparatus, where the memory refresh apparatus is configured to refresh a dynamic random access memory DRAM in a computer system, and the DRAM includes a plurality of ranks. The memory refresh apparatus includes function modules configured to implement the method according to any one of the first aspect or the possible implementations of the first aspect.

According to a fifth aspect, this application further provides a computer program product, including program code, where instructions included in the program code are executed by a computer, to implement the method according to any one of the first aspect or the possible implementations of the first aspect.

According to a sixth aspect, this application further provides a computer readable storage medium, where the computer readable storage medium is configured to store program code, and instructions included in the program code are executed by a computer, to implement the method according to any one of the first aspect or the possible implementations of the first aspect.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention.

DESCRIPTION OF EMBODIMENTS

To make a person skilled in the art better understand the technical solutions in the present invention, the following clearly describes the technical solutions in the embodiments of the present invention with reference to the accompanying drawings in the embodiments of the present invention. Apparently, the described embodiments are merely some but not all of the embodiments of the present invention.

Figure 1:
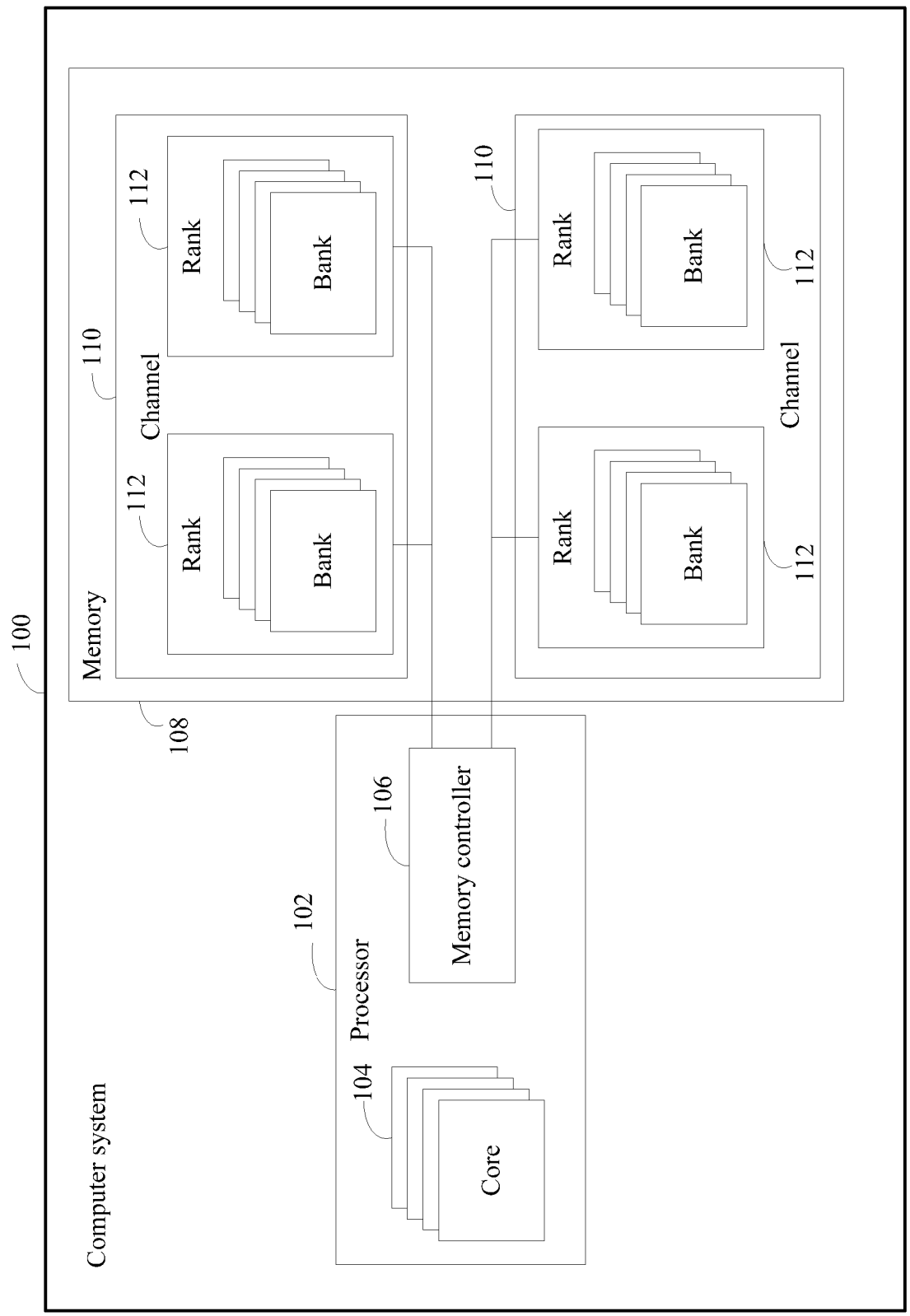
FIG. 1 is a schematic architectural diagram of a computer system according to an embodiment of the present invention.

FIG. 1 is a schematic architectural diagram of a computer system according to an embodiment of the present invention. As shown in FIG. 1, a computer system 100 may include at least a processor 102, a memory controller 106, and a memory 108. Usually, the memory controller 106 may be integrated into the processor 102. It should be noted that, in the computer system provided in this embodiment of the present invention, in addition to components shown in FIG. 1, the computer system 100 may further include other components such as a communications interface and a magnetic disk serving as an external storage. No limitation is imposed herein.

The processor 102 is a computing unit and a control unit of the computer system 100. The processor 102 may include a plurality of processor cores 104. The processor 102 may be a very large-scale integrated circuit. An operating system and another software program are installed in the processor 102, so that the processor 102 can access the memory 108, a buffer, and a magnetic disk. It may be understood that, in this embodiment of the present invention, the core 104 of the processor 102 may be, for example, a central processing unit (CPU), or may be another application-specific integrated circuit (ASIC).

The memory controller 106 is a bus circuit controller that is inside the computer system 100 and that controls the memory 108 and is configured to manage and plan data transmission from the memory 108 to the core 104. The memory 108 may exchange data with the core 104 through the memory controller 106. The memory controller 106 may be a separate chip, and connected to the core 104 through a system bus. A person skilled in the art may know that, the memory controller 106 may be integrated into the processor 102 (as shown in FIG. 1), or may be built in a northbridge. A specific location of the memory controller 106 is not limited in this embodiment of the present invention. During actual application, the memory controller 106 may control necessary logic to write data to the memory 108 or read data from the memory 108.

The memory 108 is a main memory of the computer system 100. The memory 108 is connected to the processor 102 through a double data rate (DDR) bus. The memory 108 is usually configured to store various software currently running on the operating system, input and output data, and information that is exchanged with the external storage. To increase an access speed of the processor 102, the memory 108 needs to have an advantage of a high access speed. In a conventional computer system architecture, a dynamic random access memory (DRAM) is usually used as the memory 108. Through the memory controller 106, the processor 102 can access the memory 108 at a high speed, and perform a read operation and a write operation on any storage unit in the memory 108.

In this embodiment of the present invention, that the memory 108 is a DRAM is used as an example for description. Therefore, the memory 108 may also be referred to as a DRAM 108. Data is stored in a storage unit (which may also be referred to as a DRAM cell) of the DRAM 108. In this embodiment of the present invention, the storage unit is a minimum storage unit (or cell) for storing data. Generally, one storage unit may store 1 bit data. Certainly, some storage units may alternatively store a plurality of values. As described above, the DRAM indicates data 0 or 1 by using a quantity of charges in a capacitor. The charges in the capacitor may leak away, and insufficient charges in the capacitor may result in an error in stored data. Therefore, the memory controller 106 refreshes data in the DRAM 108 at intervals of a time period, to avoid a data loss in the DRAM 108. Moreover, the DRAM 108 is volatile, and when the computer system 100 is powered off, information in the DRAM 108 is no longer saved.

During actual application, DRAM cells in the DRAM 108 are arranged into a matrix. This matrix is referred to as a DRAM bank. Any bit in the DRAM bank can be positioned by the memory controller 106 by using a corresponding row and column decoder. A plurality of DRAM banks may form a DRAM chip (which may also be referred to as a memory chip), and a plurality of DRAM chips may form a DRAM rank. A plurality of DRAM ranks may be integrated into a dual in-line memory module (Dual-Inline-Memory-Modules, DIMM). For example, as shown in FIG. 1, the DRAM 108 may include a plurality of channels 110. Each channel 110 may include at least one rank, and each rank may include at least one bank. Each bank includes a plurality of storage units for storing data. A person skilled in the art may know that, a rank is memory chips connected to a same chip select signal. The memory controller 106 can perform a write operation on chips in a same rank, and chips in a same rank share a same control signal. The memory controller 106 may access data in a storage unit in each channel in the DRAM 108 through a memory bus.

A person skilled in the art may know that, a refresh cycle of a DRAM chip is associated with a retention time of each storage unit in the DRAM chip. Currently, standard refresh cycles of commonly seen DRAM chips are all fixed. Generally, a standard refresh cycle is 64 ms. In a prior-art refresh solution, a memory controller checks, at intervals of a tREFI time, whether a rank needs to be refreshed. Each refresh needs to consume a tRFC time. tREFI is an average refresh interval of a memory. In other words, tREFI is used to indicate an average interval at which the memory controller sends a refresh command. tREFI may be determined based on a refresh cycle and a quantity of refresh commands to be sent in a refresh cycle. For example, tREFI may be 64 ms/8192=7.8 μs, where 64 ms is a refresh cycle, and 8192 is a quantity of refresh commands to be sent in a refresh cycle. tRFC is a row refresh cycle time. In other words, tRFC is used to indicate a time required for executing one refresh command in a DRAM rank. Generally, a longer tREFI indicates a larger tRFC; a shorter tREFI indicates a smaller tRFC. Within a tRFC time in a refresh process, a rank being refreshed cannot respond to a request for the rank. Therefore, a refresh frequency may be adjusted to mitigate impact caused on system performance by a refresh.

Moreover, a person skilled in the art may know that, different refresh modes have different refresh frequencies. The double data rate (DDR) protocol specifies three refresh modes: a 1× mode, a 2× mode, and a 4× mode. In the 1× mode, refresh operations are performed on a memory chip at intervals of tREFI (base) specified in the DDR protocol, and a time for executing one refresh request is tRFC1. In the 2× mode, refresh operations are performed on a memory chip at intervals of tREFI (base)/2, and a time for executing one refresh request is tRFC2. In the 4× mode, refresh operations are performed on a memory chip at intervals of tREFI (base)/4, and a time for executing one refresh request is tRFC3. tRFC1>tRFC2>tFRC3. tREFI (base) is used to indicate a standard average refresh interval defined in the DDR protocol with which the computer system complies. Usually, tREFI (base) is used to indicate tREFI in the 1× mode in a condition that a DRAM chip surface temperature is within a normal temperature range (0° C. to 85° C.). According to the DDR4 standard, values of tREFI and tRFC may be set depending on an actual status. For example, for a DRAM chip having a capacity of 8 Gb, in a 1× configuration, tREFI may be 7.8 μs, and tRFC may be 350 ns. In a 4× configuration, tREFI may be 1.95 μs, and tRFC may be 160 ns. Dynamic refresh mode adjustment is supported in the DDR4 protocol. According to the DDR4 protocol, in a memory refresh process, a memory refresh mode may be switched from one to another among the 1× mode, the 2× mode, and the 4× mode.

As described above, in the prior art, a memory controller checks, at intervals of a tREFI time, whether a rank needs to be refreshed. If the rank is in an idle state, the memory controller refreshes the rank; if the rank is not in an idle state, the memory controller postpones refreshing the rank. When a postponement time exceeds a threshold, the memory controller forcibly refreshes the rank. However, when traffic in the memory is relatively heavy, a rank is seldom in an idle state, and it is possible that the rank cannot be in an idle state. If the rank is refreshed only after the rank is idle, a refresh needs to be continually postponed. At last, when a refresh needs to be performed to avoid a data loss, not only a refresh that should be performed within a current time period needs to be performed, but also a make-up refresh for a previously postponed refresh needs to be performed. Therefore, a relatively large quantity of refreshes are caused within a time period requiring a make-up refresh. In this case, a refresh needs to be performed even if an average refresh interval tREFI is not reached. In other words, when a make-up refresh needs to be performed, an increase in passive refreshes is caused. Because a response to a request for accessing the rank cannot be made in time during a refresh, when there are a relatively large quantity of passive refreshes, an interruption time of an access service increases. Consequently, the processor may stall, or operate in lower efficiency. In this case, system performance is more impacted, and higher refresh overheads are caused.

A person skilled in the art may know that, refresh operations on ranks in the memory 108 are independent. In a research process, it is found that, in a refresh process, different refresh modes have different refresh frequencies, and different refresh frequencies result in different bus utilization rates, and therefore, in the refresh process, refresh mode selection also affects system performance. Moreover, in a process of refreshing a DRAM, a rank being refreshed cannot respond to a request in the refresh process, resulting in refresh overheads of a system; furthermore, in the refresh process, requests for a rank being refreshed congest a scheduling queue, causing that a request for another rank cannot enter the scheduling queue to be sent to the another rank in time. This is also a cause affecting overall system performance.

To reduce refresh overheads of the computer system, and improve overall performance of the computer system in a refresh process, an embodiment of the present invention provides a memory refresh method, so that a memory scheduling policy can be improved, and a system bus utilization rate can be improved by dynamically adjusting a refresh frequency. Moreover, a failure in execution of a request for another rank due to congestion of refresh operations on a scheduling queue can also be avoided. Therefore, refresh overheads can be reduced, and system performance in the refresh process can be improved. The following describes in detail a memory refresh solution in the computer system provided in this embodiment of the present invention with reference to FIG. 1.

Figure 2:
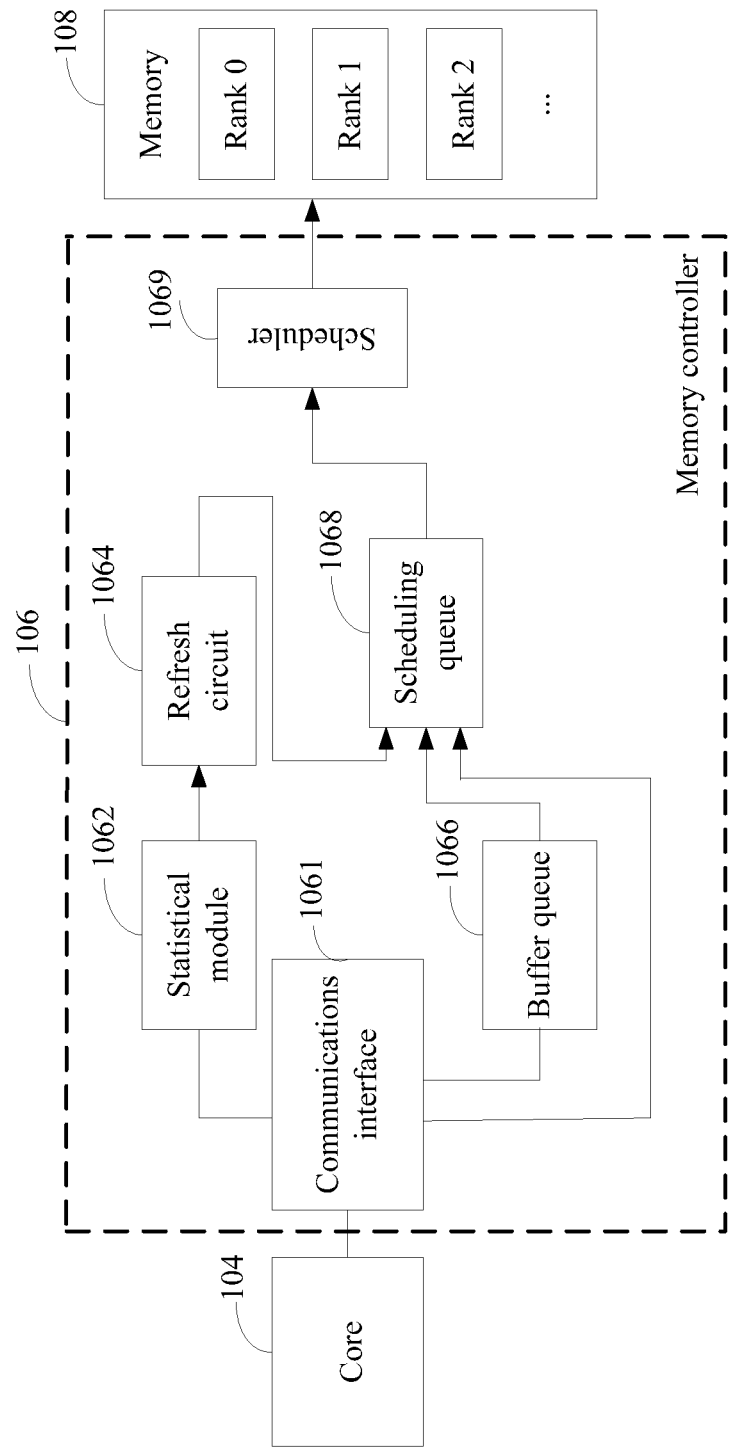
FIG. 2 is a schematic structural diagram of a memory controller according to an embodiment of the present invention.

FIG. 2 is a schematic structural diagram of a memory controller 106 according to an embodiment of the present invention. For clear description, FIG. 2 also schematically shows connections between the memory controller 106 and a processor core 104 and between the memory controller 106 and a memory 108. The memory 108 may include a plurality of ranks such as a rank 0, a rank 1, and a rank 2. As shown in FIG. 2, the memory controller 106 may include a communications interface 1061, a statistical module 1062, a refresh circuit 1064, a buffer queue 1066, a scheduling queue 1068, and a scheduler 1069.

In this embodiment of the present invention, the communications interface 1061 in the memory controller 106 may include a front-end interface connected to a processor 102 in a computer, and may also include a back-end interface connected to the memory 108. Specifically, the memory controller 106 may receive, through the communications interface 1061, an access request sent by a processor (for example, a core 104 in FIG. 1) in a computer system. Through the communications interface 1061, the memory controller 106 may store data into the memory 108 or read data from the memory 108.

The statistical module 1062 may include statistical functions in two aspects. First, the statistical module 1062 may be configured to collect statistics on a distribution of target ranks of access requests received by the memory controller 106 and operation types of the access requests. The target rank is a rank to be accessed by using an access request. The operation types of the access requests may include types such as read operation and write operation. Specifically, the statistical module 1062 may collect statistics on target ranks of access requests, and obtain operation types in the access requests. Second, the statistical module 1062 may further collect statistics on a quantity of the access requests received by the memory controller 106. Specifically, the statistical module 1062 may collect statistics on a quantity of access requests for each to-be-accessed rank and a total quantity of access requests received by the memory controller 106. The statistical module 1062 may collect statistics based on access requests buffered in the buffer queue 1066 and the scheduling queue 1068. During actual application, the statistical module 1062 may be implemented by a counter. In other words, the statistical module 1062 may include one or more counters. In this embodiment of the present invention, the access request is a request of the processor for accessing the memory. The access request may include a read request, a write request, and the like. In other words, the processor may read data from the memory or write data to the memory according to the access request.

The refresh circuit 1064 is configured to determine, at an interval of a tREFI time based on a statistical result of the statistical module 1062, whether to generate a refresh request, and put the generated refresh request into the scheduling queue. For example, when the statistical module 1062 obtains, through statistics collection, that a quantity of access requests for a rank is less than a specified threshold, the refresh circuit 1064 may generate a refresh request for the rank, and put the refresh request into the scheduling queue 1068. It may be understood that, during actual application, the refresh request generated by the refresh circuit 1064 may alternatively be directly sent to the scheduler 1069, so that the scheduler 1069 sends the generated refresh request to the memory 108, and the memory 108 performs a refresh operation on the corresponding rank according to the generated refresh request. It should be noted that, tREFI is used to indicate an average refresh interval. During actual application, the refresh circuit 1064 may alternatively generate a refresh request at an interval less than tREFI. For example, when a make-up refresh needs to be performed, the refresh circuit 1064 may generate a refresh request at an interval less than tREFI. In addition, a person skilled in the art may know that tREFI varies with different refresh modes.

The buffer queue 1066 is configured to: in a process of performing a refresh operation on a rank, buffer an access request, sent by the core 104, for the rank. In other words, the buffer queue 1066 is configured to buffer a newly received access request for a rank on which a refresh operation is being performed. For example, the rank 0 in the memory 108 is used as an example. In a process of performing a refresh operation on the rank 0, if the memory controller 106 receives a read request from the core 104 for the rank 0, the read request may be buffered in the buffer queue 1066, rather than the scheduling queue 1068. During actual application, a scheduling priority may be further set for an access request in the buffer queue 1066. For example, some access requests may be set to be preferential scheduling or normal scheduling.

The scheduling queue 1068 is configured to buffer an access request to be sent to a rank. For example, the scheduling queue 1068 may be configured to buffer an operation request such as an access request sent by the core 104 and a refresh request sent by the refresh circuit 1064. Further, in this embodiment of the present invention, the scheduling queue 1068 is configured to buffer an access request to be sent to a rank on which a refresh operation is not being performed. The scheduler 1069 is configured to send the operation request (including at least the access request and the refresh request) in the scheduling queue 1068 to the memory 108, so as to implement an operation, for example, accessing or refreshing the memory 108. In this embodiment of the present invention, the buffer queue 1066 is an upfront buffer of the scheduling queue 1068. In this manner, the buffer queue 1066 may be configured to buffer an access request that is to enter the scheduling queue 1068. In this embodiment of the present invention, for convenient description, that two levels of buffers including the buffer queue 1066 and the scheduling queue 1068 are configured is used as an example in this embodiment of the present invention. During actual application, more levels of buffers may be configured depending on a requirement. For example, more levels of buffer queues 1066 may be configured ahead of the scheduling queue 1068.

As described above, the double data rate (DDR) protocol specifies three refresh modes: a 1× mode, a 2× mode, and a 4× mode. In this embodiment of the present invention, the refresh mode may include at least a first refresh mode and a second refresh mode. In the first refresh mode, the memory controller performs refreshes at intervals of tREFI (base)/N. In the second refresh mode, the memory controller performs refreshes at intervals of tREFI (base). For example, the first refresh mode may be the 4× mode, and the second refresh mode may include the 1× mode. tREFI (base) is used to indicate a standard average refresh interval defined in the DDR protocol, and N is an integer greater than 1. Usually, tREFI (base) is used to indicate tREFI in the 1× mode in a condition that a DRAM chip surface temperature is within a normal temperature range (0° C. to 85° C.). For convenient description, tREFI (base) may also be denoted by T in this embodiment of the present invention.

For a memory system, a decrease in a refresh frequency is of more significance to system performance improvement than a decrease in postponed refreshes. Therefore, usually, performing refreshes in the 4× mode results in lower system performance than performing refreshes in the 1× mode. Moreover, when there is a relatively high proportion of read requests or write requests in the access requests, the memory 108 has a relatively high bandwidth utilization rate due to a relatively small quantity of switches between read and write. However, in a process of implementing the present invention, it is found that, because the DDR protocol specifies a four active window (Four Active Window, tFAW), when there are a relatively small quantity of to-be-accessed target ranks for a plurality of access requests, in other words, when a plurality of access requests concentrate on a relatively small quantity of ranks in the memory 108, in the tFAW time window, a quantity of rows in one rank that are simultaneously operatable is limited, and therefore overall system performance decreases, instead. tFAW means that within the tFAW time window, one rank allows a maximum of four row active commands to be sent. Take two ranks in the memory 108 as an example. When a proportion of read requests or write requests is relatively high and access requests concentrate on one of the ranks, the other rank is being refreshed. A longer refresh time indicates longer single-rank access duration, and a larger decrease in overall system performance.

In a process of implementing the present invention, it is found that, in comparison between the 4× mode and the 1× mode, because a single refresh time tRFC3 for a refresh in the 4× mode is relatively small, in a single refresh process, impact caused on a system by a tFAW limitation is relatively small, and a decrease in overall system performance is relatively small. Therefore, in this embodiment of the present invention, to improve overall system performance, and reduce the tFAW limitation on a system, in a memory refresh method provided in an embodiment of the present invention, a refresh mode can be dynamically adjusted, to reduce refresh overheads of a system and improve system performance.

Figure 3:
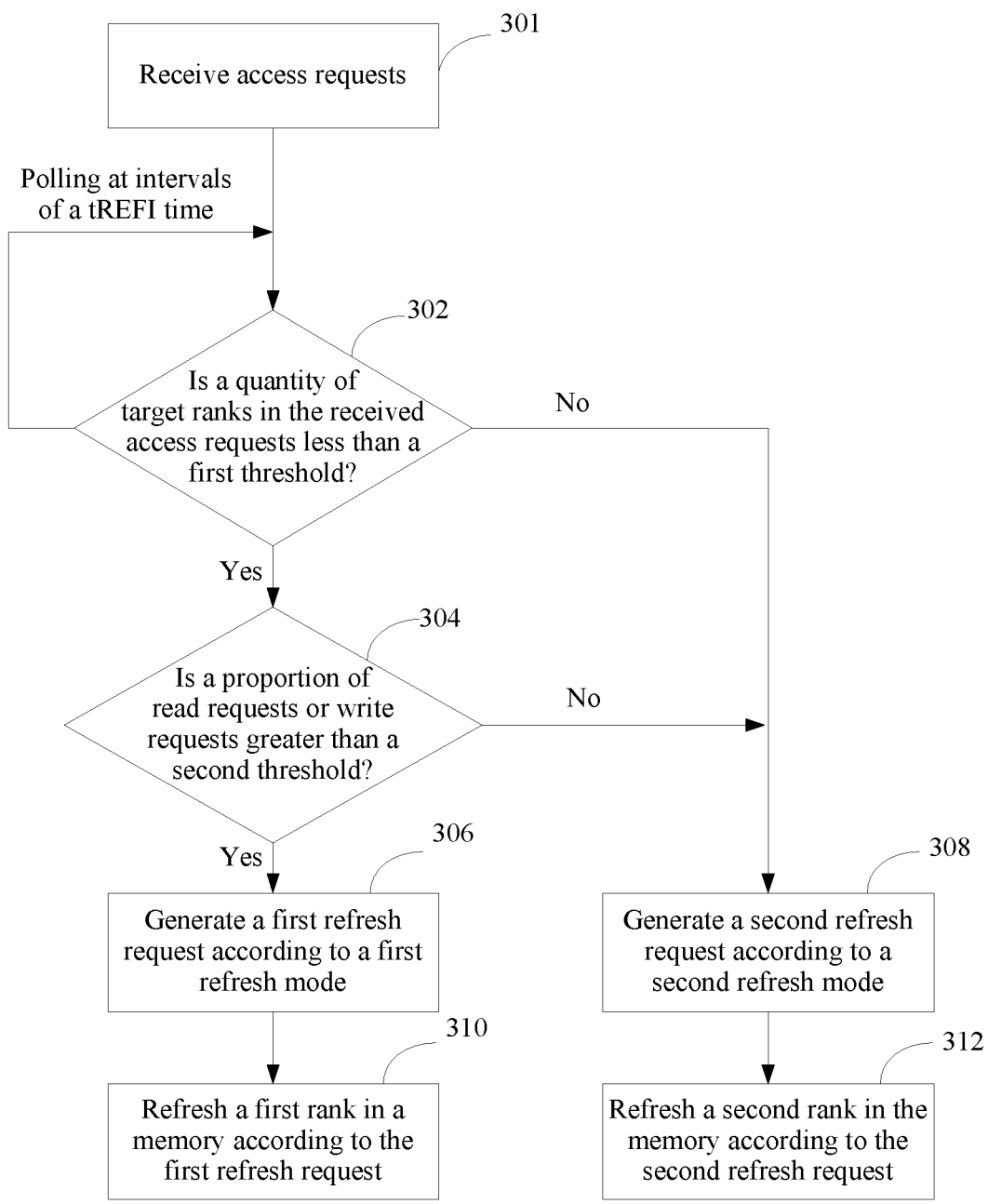
FIG. 3 is a schematic flowchart of a memory refresh method according to an embodiment of the present invention.

The following describes in detail a memory refresh method provided in an embodiment of the present invention with reference to FIG. 3. FIG. 3 is a flowchart of a memory refresh method according to an embodiment of the present invention. The memory refresh method shown in FIG. 3 may be performed by the memory controller 106 shown in FIG. 1 and FIG. 2. As shown in FIG. 3, the method may include the following steps.

In step 301, the memory controller 106 receives access requests sent by a core 104. In this embodiment of the present invention, the access request is a request used to access a memory 108. The memory controller 106 may read data from the memory 108 or write data to the memory 108 according to the access request. Operation types of the access requests may include types such as read operation and write operation. During actual application, through a communications interface between the memory controller 106 and the core 104, the memory controller 106 can receive the access request sent by the core 104.

In step 302, the memory controller 106 determines whether a quantity of target ranks of access requests received within a first time period is less than a specified first threshold. A person skilled in the art may know that, the memory controller checks, at intervals of a tREFI time, whether a rank needs to be refreshed. Each refresh needs to consume a tRFC time. tREFI is used to indicate an average refresh interval, and tRFC is used to indicate a row refresh cycle time. In other words, tREFI is used to indicate an interval at which the memory controller sends a refresh command, and tRFC is used to indicate a time required for executing one refresh command in a DRAM rank. In this embodiment of the present invention, for convenient description, a process in which the memory controller 106 checks whether a rank needs to be refreshed is referred to as a refresh polling process. One tREFI time is referred to as a time period. In other words, the memory controller 106 performs refresh polling once at intervals of a tREFI time.

In this embodiment of the present invention, one refresh polling process is used as an example for description. In this step, in a first refresh polling process, a refresh circuit 1064 in the memory controller 106 may determine, based on a distribution of to-be-accessed target ranks of the access requests that is obtained by a statistical module 1062 through statistics collection, whether the quantity of the target ranks of the access requests received by the memory controller 106 within the first time period is less than the specified first threshold. In this embodiment of the present invention, a target rank is a rank to be accessed by using an access request. The quantity of the target ranks is a quantity of ranks to be accessed by using the access requests. In one case, in a refresh polling process, the memory controller 106 may determine, based on a quantity, obtained by the statistical module 1062 through statistics collection, of target ranks of to-be-processed access requests buffered in the memory controller 106, whether the quantity of the target ranks is greater than the specified first threshold. In another case, the memory controller 106 may determine, based on a quantity, obtained by the statistical module 1062 through statistics collection, of target ranks of access requests received by the memory controller 106 within a specified time period, whether the quantity of the target ranks is greater than the first threshold. The specified time period may be a time period not greater than tREFI. The first threshold is greater than 0, and the first threshold is less than a total quantity of ranks in the memory 108. During actual application, the first threshold may be determined based on the total quantity of the ranks in the memory 108. For example, the first threshold may be set to a half of a total quantity of ranks in a DRAM. When the quantity of the target ranks of the access requests is less than the first threshold, the method goes to step 304. When the quantity of the target ranks of the access requests is not less than the first threshold, the method goes to step 306.

In this step, the first threshold is used to determine whether the to-be-accessed target ranks of the access requests received by the memory controller are concentrated. In this embodiment of the present invention, the first threshold may be determined based on the total quantity of the ranks in the memory 108. For example, when the memory 108 includes four ranks, the first threshold may be set to 2.

In step 304, the memory controller 106 determines whether a proportion of read requests or write requests in the received access requests is greater than a second threshold. As described above, when there is a relatively high proportion of read requests or write requests in the access requests, the memory 108 has a relatively high bandwidth utilization rate due to a relatively small quantity of switches between read and write. In this embodiment of the present invention, the second threshold is used to determine whether the proportion of read requests or write requests in the access requests is relatively high. Therefore, during actual application, the second threshold may be set to a relatively high proportion. For example, when the proportion of read requests is measured by a proportion of a quantity of read requests in a total quantity of received access requests, the second threshold may be 60%.

In this embodiment of the present invention, the proportion of read requests is used to indicate a proportion of read requests in the received access requests. The proportion of write requests is used to indicate a proportion of write requests in the received access requests. For example, the proportion of read requests may be represented by a proportion of the quantity of the read requests in the total quantity of the access requests. The proportion of write requests may be represented by a proportion of the quantity of the write requests in the total quantity of the access requests. During actual application, the proportion of read requests may be represented by a ratio of a quantity of read requests to a quantity of write requests. The proportion of write requests may be represented by a ratio of a quantity of write requests to a quantity of read requests. No limitation is imposed herein, provided that the proportion of read requests or the proportion of write requests can be determined.

It may be understood that, when the proportion of read requests in the access requests is higher than the second threshold, it indicates that there are a relatively large quantity of read requests within the first time period. When the proportion of write requests in the access requests is higher than the second threshold, it indicates that there are a relatively large quantity of write requests within the first time period. In this embodiment of the present invention, when the proportion of read requests or write requests in the access requests is greater than the second threshold, the method goes to step 306. When the proportion of read requests or write requests in the access requests is not greater than the second threshold, the method goes to step 308.

In step 306, the memory controller 106 generates a first refresh request according to a first refresh mode. In this embodiment of the present invention, when the refresh circuit 1064 determines, based on a statistical result of the statistical module 1062, that the quantity of the to-be-accessed target ranks of the access requests is less than the specified first threshold and the proportion of read requests or write requests in the access requests is greater than the specified second threshold, the refresh circuit 1064 in the memory controller 106 may determine to refresh first rank in the first refresh mode. In the first refresh mode, the memory controller performs a refresh at an interval of tREFI (base)/N, where tREFI (base) is used to indicate a standard average refresh interval, and N is an integer greater than 1. For example, the first refresh mode may be a 4× mode or a 2× mode. In other words, when the to-be-accessed target ranks of the access requests received by the memory controller 106 are relatively concentrated and the proportion of read requests or the proportion of write requests is relatively high, the first rank may be refreshed in the 4× or 2× mode.

In step 308, the memory controller 106 generates a second refresh request according to a second refresh mode. In this embodiment of the present invention, when the refresh circuit 1064 determines, based on a statistical result of the statistical module 1062, that the quantity of the to-be-accessed target ranks of the access requests is not less than the specified first threshold or the proportion of read requests or write requests in the received access requests is not greater than the second threshold, the refresh circuit 1064 in the memory controller 106 may determine to refresh the first rank in the second refresh mode. Specifically, the memory controller 106 may generate the second refresh request according to the second refresh mode. In the second refresh mode, the memory controller performs a refresh at an interval of tREFI (base), where tREFI (base) is used to indicate a standard average refresh interval. In this embodiment of the present invention, the second refresh mode may be a 1× mode. In other words, when the to-be-accessed target ranks of the access requests received by the memory controller 106 are not concentrated and the proportion of read requests and the proportion of write requests are relatively equivalent, indicating that a relatively large quantity of switches between read and write is required, the first rank may be refreshed in the 1× mode.

In step 310, the memory controller 106 refreshes a first rank in the memory according to the first refresh request. The first rank is any rank to be refreshed in the memory. Specifically, in step 306, after the refresh circuit 1064 in the memory controller 106 generates the first refresh request, the memory controller 106 may put the generated first refresh request into a scheduling queue 1068, so that in step 310, a scheduler 1069 sends the first refresh request in the scheduling queue 1068 to the memory 108, and the memory 108 may perform a refresh operation on the first rank according to the first refresh request generated by the memory controller 106.

In step 312, the memory controller 106 refreshes a first rank in the memory according to the second refresh request. Specifically, in step 308, after the refresh circuit 1064 in the memory controller 106 generates the second refresh request, the memory controller 106 may put the generated second refresh request into a scheduling queue 1068, so that in step 312, a scheduler 1069 sends the second refresh request in the scheduling queue 1068 to the memory 108, and the memory 108 may perform a refresh operation on the first rank according to the second refresh request generated by the memory controller 106.

It may be understood that, FIG. 3 is described by using only the first refresh polling process as an example. During actual application, in different refresh polling processes, a refresh mode for the first rank may be dynamically adjusted based on the distribution of the to-be-accessed target ranks of the access requests and the proportion of read requests or write requests. For example, in the first refresh polling process, the memory controller 106 may refresh the first rank in the first refresh mode. In a second refresh polling process, the memory controller 106 may refresh a second rank in the second refresh mode.

In conclusion, when the to-be-accessed target ranks of the access requests are relatively concentrated and the proportion of read requests or write requests in the access requests is relatively high, a quantity of rows in one rank that are simultaneously operatable is limited by tFAW, and consequently, overall system performance in a refresh process decreases greatly. In this embodiment of the present invention, to improve system performance, the refresh mode may be dynamically adjusted based on the distribution of the target ranks of the access requests and the proportion of read requests or write requests in the access requests, so that system performance overheads caused by a tFAW limitation can be compensated for by adjusting a refresh frequency, and further, system performance in the refresh process can be improved. Moreover, in comparison with the prior art, in the memory refresh method provided in this embodiment of the present invention, the refresh mode can be determined based on a characteristic of the access requests in the current refresh process, so that the determined refresh mode is strongly associated with the refresh process, thereby effectively reducing refresh overheads and improving system performance.

In the foregoing embodiment, system performance in a refresh process is improved from a perspective of adjusting a refresh frequency. To further improve refresh performance of a system, in an embodiment of the present invention, a prior-art refresh method is further optimized from a perspective of a refresh time point, to further improve overall performance of the system in a memory refresh process. The following further describes the memory refresh method provided in this embodiment of the present invention with reference to FIG. 4.

In step 402, a memory controller 106 determines whether a quantity of received access requests is greater than a third threshold. As described above, to avoid a data loss in a memory, the memory controller 106 checks, at intervals of a tREFI time, whether a rank needs to be refreshed. Specifically, in a refresh polling process, the memory controller 106 may determine, based on a quantity, obtained by a statistical module 1062 through statistics collection, of to-be-processed access requests buffered in the memory controller 106, whether the quantity of the access requests is greater than the third threshold. In another case, the memory controller 106 may determine, based on a quantity, obtained by a statistical module 1062 through statistics collection, of access requests received by the memory controller 106 within a specified time period, whether the quantity of the access requests is greater than the third threshold. The specified time period may be a time period not greater than tREFI. The third threshold is an integer greater than 0, and the third threshold may be preset according to a magnitude of traffic during actual application. For example, the third threshold may be set to 100. When the quantity of the access requests received by the memory controller 106 is greater than the third threshold, indicating that there are a relatively large quantity of access requests, the method goes to step 404. When the quantity of the access requests received by the memory controller 106 is not greater than the third threshold, the method goes to step 406.

In step 404, the memory controller 106 determines whether a quantity of access requests for accessing a first rank is greater than a fourth threshold. The first rank may be any rank in the memory 108. In this embodiment of the present invention, the memory controller 106 may determine, based on a quantity, obtained by the statistical module 1062 through statistics collection, of access requests for the first rank, whether the quantity of the access requests for the first rank is less than the fourth threshold. The fourth threshold may be specifically set depending on an application scenario, and the fourth threshold is greater than 0. When the quantity of the access requests for accessing the first rank is less than the fourth threshold, the method goes to step 410. When the quantity of the access requests for accessing the first rank is not less than the fourth threshold, the method goes to step 408. It should be noted that, the quantity of the access requests for the first rank may be a quantity of access requests for the first rank that are received by the memory controller 106 within the time period specified in step 402, or may be a quantity of to-be-processed access requests for the first rank that are buffered in the memory controller 106.

In step 406, the memory controller 106 determines whether a first rank is in an idle state. Specifically, when in step 402, the memory controller 106 determines that the quantity of the received access requests is greater than the third threshold, it indicates that the entire memory has relatively heavy access traffic, and in this case, the memory controller 106 needs to further determine whether the first rank needs to be refreshed. If the first rank is in an idle state, in other words, if no request for accessing the first rank exists in a scheduling queue of the memory controller, the method goes to step 410. If the first rank is not in an idle state, in other words, if an access request for accessing the first rank exists in a scheduling queue of the memory controller, the method goes to step 408.

In step 408, the memory controller 106 determines whether a quantity of postponed refreshes on the first rank is greater than a specified fifth threshold. When the memory controller 106 determines that the quantity of the postponed refreshes on the first rank is greater than the fifth threshold, the method goes to step 410. When the memory controller 106 determines that the quantity of the postponed refreshes on the first rank is not greater than the fifth threshold, the method goes to step 412. In this embodiment of the present invention, the fifth threshold is not less than 1 and is less than a specified warning value. The warning value may be determined based on a maximum quantity of refresh commands that can be postponed for the rank (postponing refresh commands). For example, according to the DDR4 standard, a maximum of eight refresh commands can be postponed for a rank; in other words, the warning value is 8, and the fifth threshold needs to be less than 8. For example, the fifth threshold may be set to 6.

In this embodiment of the present invention, a postponement counter (not shown in FIG. 2) may be disposed in the refresh circuit 1064, and the postponement counter may be configured to collect statistics on the quantity of the postponed refreshes on the first rank. During actual application, the postponement counter may alternatively be disposed independent of the refresh circuit 1064. In another case, a postponement counter may be not disposed, and instead, the quantity of the postponed refreshes on the first rank is obtained by using software through statistics collection. In this embodiment of the present invention, no limitation is imposed on a manner how the quantity of the postponed refreshes on the first rank is specifically obtained through statistics collection.

In step 410, the memory controller 106 refreshes the first rank. Specifically, the refresh circuit 1064 in the memory controller 106 may determine a refresh mode based on the quantity of the access requests, types of the access requests, and a distribution of target ranks that are obtained by the statistical module 1062 through statistics collection, and generate a refresh request according to the determined refresh mode, to refresh the first rank according to the generated refresh request. Specifically, the refresh circuit 1064 generates a corresponding refresh request according to the determined refresh mode (for example, the 1× mode or the 4× mode), and puts the generated refresh request into the scheduling queue 1068, so that the scheduler 1069 sends the generated refresh request to the memory 108, and the memory 108 may perform a refresh operation on the first rank according to the refresh request generated by the memory controller 106. For example, when the memory controller 106 performs a refresh in the first refresh mode determined according to the method shown in FIG. 3, in this step, the memory controller 106 may refresh the first rank according to a generated first refresh request. If the memory controller 106 performs a refresh in the second refresh mode determined according to the method shown in FIG. 3, in this step, the memory controller 106 may refresh the first rank according to a generated second refresh request.

It may be understood that, when the memory controller 106 determines that a refresh operation needs to be performed on the first rank, if the memory controller 106 is executing an access request for the first rank, or the scheduling queue still has an access request for the first rank, the memory controller 106 may send the refresh request only after both the access request being executed for the first rank and the access request for the first rank in the scheduling queue are processed, to avoid affecting system performance.

In step 412, the memory controller 106 postpones a refresh operation on the first rank. Specifically, when in step 408, the memory controller 106 determines that a quantity of postponed operations on the first rank is not greater than the fifth threshold, the memory controller postpones the refresh operation on the first rank, and adds 1 to a value of the postponement counter. In other words, when the memory controller 106 determines through step 406 that the first rank is not in an idle state, that is, when an access request for the first rank is being processed or the scheduling queue still includes an access request for the first rank, if a quantity of postponed refreshes on the first rank does not reach the fifth threshold, it may be considered that there are a relatively large quantity of access requests for the first rank. To avoid affecting performance, the refresh operation is not performed on the first rank, so as to perform the refresh operation on the first rank in a subsequent polling process. As described above, the fifth threshold is less than a specified warning value. The warning value may be determined based on a maximum quantity of refresh commands that can be postponed for the first rank. The warning value is used to indicate a need to immediately perform a refresh operation on the first rank. In other words, the warning value is used to instruct the memory controller 106 to forcibly perform a refresh operation on the first rank.

It may be understood that, when a refresh operation is forcibly performed on the first rank, a make-up refresh needs to be performed for a previously postponed refresh. Therefore, a relatively large quantity of refreshes are caused within a time period requiring a make-up refresh. Within a particular make-up refresh time period, in one aspect, a failure to execute an access request, put into the scheduling queue, for the first rank may be caused; consequently, space of the scheduling queue 1068 is occupied for a relatively long time, and an access request for another rank cannot enter the scheduling queue, affecting performance of the entire computer system. In another aspect, a system service may be interrupted due to an increase in refreshes within a short time. In short, forcibly refreshing the first rank increases refresh power consumption of the computer system 100, and affects system performance.

In conclusion, in the refresh method provided in this embodiment of the present invention, in one tREFI polling process, the following several cases may exist with respect to the refresh operation on the first rank.

Case 1: When the quantity of the access requests received by the memory controller 106 is greater than the third threshold and the quantity of the access requests for accessing the first rank is less than the fourth threshold, the memory controller 106 may perform the refresh operation on the first rank in a refresh mode determined according to the memory refresh method shown in FIG. 3. In other words, when access traffic of the computer system 100 is relatively heavy, provided that the quantity of the access requests for accessing the first rank is relatively small, the memory controller 106 may actively perform the refresh operation on the first rank, instead of performing the refresh operation on the first rank only after the first rank is in an idle state. This is because, when the access traffic of the computer system 100 is relatively heavy, the first rank is very unlikely to be in an idle state, and if a refresh is continually postponed, during a subsequent forcible refresh to avoid a data loss, an increase in refreshes may be caused within a particular time, resulting in a passive refresh state. Such an active refresh manner provided in this embodiment of the present invention can mitigate impact caused on performance of the computer system by passive refreshes caused by refresh postponements, and improve memory refresh flexibility. Therefore, performance of the computer system can be improved, and refresh overheads can be reduced. Certainly, it may be understood that, in this embodiment of the present invention, that the quantity of the access requests for accessing the first rank is less than the specified fourth threshold includes a case in which the first rank is idle.

Case 2: When the quantity of the access requests received by the memory controller 106 is greater than the third threshold, the quantity of the access requests for accessing the first rank is not less than the fourth threshold, and the quantity of the postponed refreshes on the first rank is greater than the fifth threshold, the memory controller 106 may perform the refresh operation on the first rank in a refresh mode determined according to the memory refresh method shown in FIG. 3. In other words, when memory access traffic in the computer system 100 is relatively heavy and the quantity of the access requests for the first rank is also relatively large, if the quantity of the postponed refreshes on the first rank is greater than the fifth threshold, the refresh operation needs to be immediately performed on the first rank, so as to avoid a possibility of a need to perform a forcible refresh because the quantity of the postponed refreshes on the first rank reaches the warning value, and mitigate impact caused on performance of the computer system by an increase in passive refreshes, thereby improving memory refresh flexibility. It may be understood that, the third threshold is a threshold specified with reference to the warning value during actual application, so that the computer system can postpone a refresh within a specific range without affecting performance, thereby improving memory refresh flexibility.

Case 3: When the quantity of the access requests received by the memory controller 106 is greater than the third threshold, the quantity of the access requests for accessing the first rank is not less than the fourth threshold, and the quantity of the postponed refreshes on the first rank is not greater than the fifth threshold, the refresh operation on the first rank may be postponed. In other words, in this embodiment of the present invention, when memory access traffic in the computer system 100 is relatively heavy and the quantity of the access requests for the first rank is also relatively large, provided that the quantity of the postponed refreshes on the first rank has not reached the preset fifth threshold, to avoid affecting processing on an access request for the first rank in the scheduling queue 1068, the refresh operation on the first rank may be postponed.

Case 4: When the quantity of the access requests received by the memory controller 106 is not greater than the third threshold and the first rank is in an idle state, the memory controller 106 may perform the refresh operation on the first rank in a refresh mode determined according to the memory refresh method shown in FIG. 3. In other words, when memory traffic of the computer system 100 is relatively light and the first rank is in an idle state, the refresh operation on the first rank causes relatively small impact on performance of the computer system. Therefore, the refresh operation may be directly performed on the first rank.

Case 5: When the quantity of the access requests received by the memory controller 106 is not greater than the third threshold, the first rank is not in an idle state, and the quantity of the postponed refreshes on the first rank is greater than the fifth threshold, the memory controller 106 needs to actively perform the refresh operation on the first rank in a refresh mode determined according to the memory refresh method shown in FIG. 3. In other words, when memory traffic of the computer system 100 is relatively light but the first rank is relatively busy, to avoid a forcible refresh on the first rank, the refresh operation needs to be performed on the first rank in the current polling process, so as to avoid an increase in passive refreshes on the system because the quantity of the postponed refreshes reaches the warning value, and mitigate impact on performance of the computer system by the passive refreshes.

Case 6: When the quantity of the access requests received by the memory controller 106 is not greater than the third threshold, the first rank is not in an idle state, and the quantity of the postponed refreshes on the first rank is not greater than the fifth threshold, the memory controller 106 may postpone the refresh operation on the first rank. In other words, when memory traffic of the computer system 100 is relatively light but the first rank is relatively busy, to process access requests for the first rank as many as possible, when the quantity of the postponed refreshes on the first rank is still not greater than the fifth threshold, the refresh operation on the first rank may be postponed.

It may be understood that, all the above descriptions about the memory refresh method provided in this embodiment of the present invention are made by using the refresh operation on the first rank in the memory 108 in one refresh polling process as an example. During actual application, in each refresh polling process, the memory controller may determine, according to the method provided above, whether ranks in the memory 108 need to be refreshed. For example, in a first refresh polling process, the memory controller 106 may determine to refresh the first rank according to case 1, refresh a second rank in the memory 108 according to case 2, and postpone a refresh operation on a third rank in the memory 108 according to case 3. In a second refresh polling process, the memory controller 106 may postpone refreshing the first rank according to case 6, and refresh the second rank according to case 5.

Further, the memory controller 106 cannot respond to an access request for the first rank either within the tRFC time period in which the refresh operation is being performed on the first rank. Therefore, to prevent the access request for the first rank from congesting the scheduling queue 1068, causing that an access request for another rank (for example, the second rank) cannot enter the scheduling queue 1068 and affecting system performance, in this embodiment of the present invention, when the refresh operation is being performed on the first rank, if the memory controller 106 receives an access request for the first rank, the memory controller 106 may put the access request for the first rank into a buffer queue 1066.

After the memory controller 106 performs the refresh operation on the first rank, the access request for the first rank in the buffer queue 1066 is put from the buffer queue 1066 into the scheduling queue 1068. Moreover, in this embodiment of the present invention, after performing the refresh operation on the first rank, the memory controller 106 may directly put a subsequently newly received access request for the first rank into the scheduling queue 1068 rather than the buffer queue 1066.

It may be understood that, in this embodiment of the present invention, when the refresh operation is being performed on the first rank, if no refresh operation is being performed on the second rank in the memory 108, the memory controller 106 may directly put a received access request for the second rank into the scheduling queue 1068. In this scheduling manner, target ranks of access requests in the scheduling queue may be distributed in a scattered manner, so that in a process of performing the refresh operation on the first rank, the memory controller 106 can process access requests for different ranks as many as possible, so as to reduce system overheads of the computer system 100 in a refresh operation process, and improve execution efficiency of the computer system 100.

It may be learned from the refresh method provided in this embodiment of the present invention that, in this embodiment of the present invention, to mitigate impact caused on performance of the computer system by a memory refresh process, both a status of the received access requests and a status of a to-be-accessed target rank are comprehensively considered for determining whether the target rank needs to be refreshed. In this way, by managing a refresh time of the memory controller, on a basis of compatibility with the existing DDR protocol, impact on performance of the computer system by an increase in passive refreshes caused by refresh postponements is mitigated, memory refresh flexibility is improved, and refresh overheads are reduced. Moreover, in this embodiment of the present invention, when the refresh operation needs to be performed on the first rank, a different refresh mode may be further selected based on a distribution of target ranks and a type distribution of the access requests, to improve refresh efficiency of the memory controller, and improve performance of the computer system.

Further, in this embodiment of the present invention, to improve concurrency of access requests, so that the refresh operation on the first rank does not affect processing on an access request for another rank, a plurality of buffer levels may be configured in the memory controller. For example, the scheduling queue and the buffer queue may be separately configured. In this way, an access request for the first rank that is received within the tRFC time period in which the refresh operation is being performed on the first rank may be buffered in the buffer queue, so as to prevent the access request for the first rank that is received within the tRFC time period from congesting the scheduling queue and from affecting processing of the memory controller on the access request for the another rank in the process of refreshing the first rank. Processing efficiency of the entire computer system is further improved.

Figure 4:
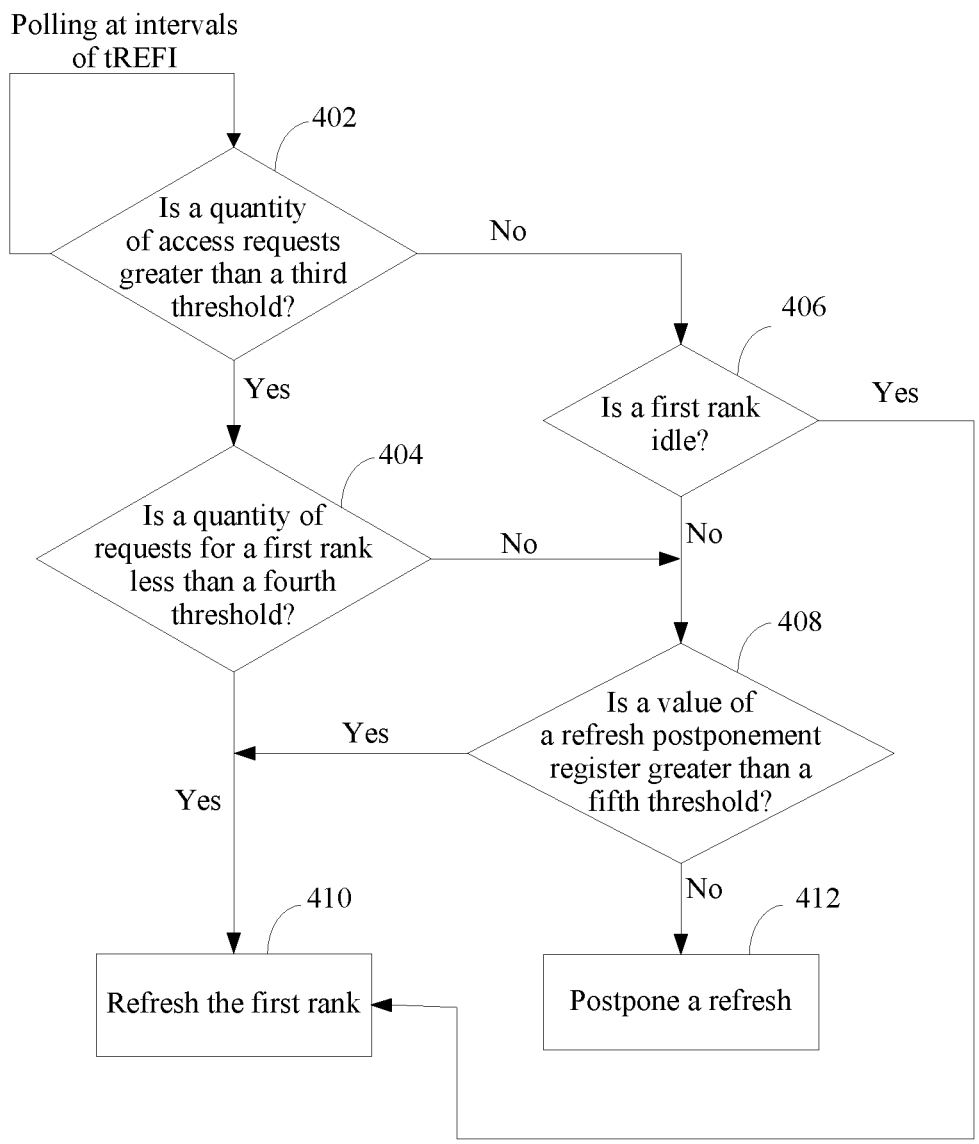
FIG. 4 is a schematic flowchart of another memory refresh method according to an embodiment of the present invention.

It should be noted that, during actual application, each step in the embodiment shown in FIG. 4 is not necessarily performed. For example, the memory refresh method is described with reference to a magnitude of access traffic in the entire system in the embodiment shown in FIG. 4, for example, in a polling process, step 402 may be first performed to determine whether the quantity of the access requests received by the memory controller 106 is greater than the third threshold. However, during actual application, a magnitude of access traffic in the entire system may be not differentiated, but instead, processing is directly performed based on an access traffic status of a to-be-refreshed rank. In this case, step 402 in the embodiment of FIG. 4 is not necessary. In other words, the refresh method provided in this embodiment of the present invention can be used in both a case of heavy access traffic of a system and a case of light access traffic of a system. No limitation is imposed herein.

Figure 5:
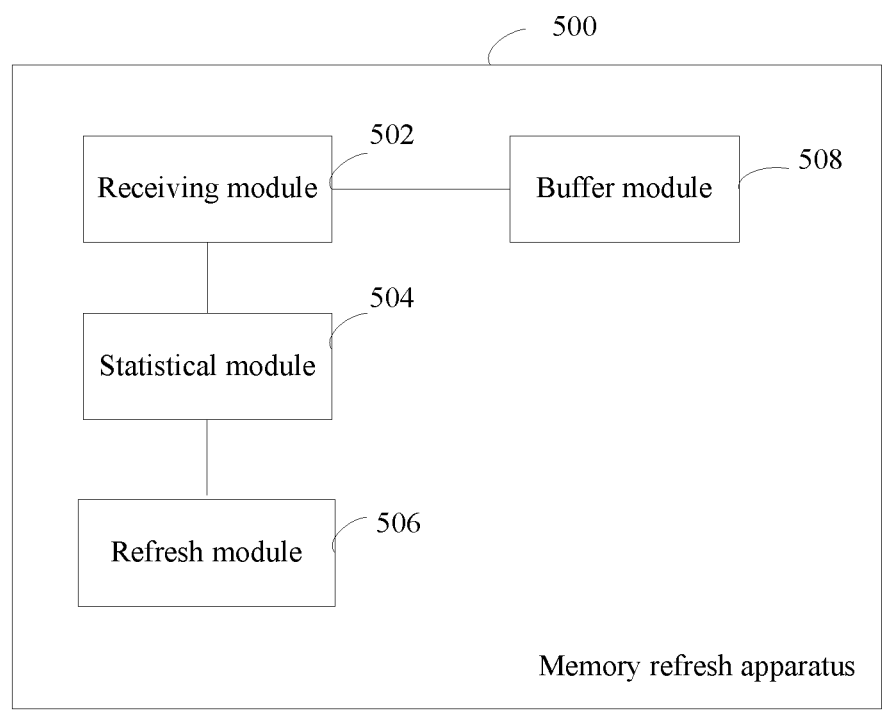
FIG. 5 is a schematic structural diagram of a memory refresh apparatus according to an embodiment of the present invention.

FIG. 5 is a schematic structural diagram of a memory refresh apparatus according to an embodiment of the present invention. The memory refresh apparatus 500 shown in FIG. 5 is configured to refresh the memory 108 shown in FIG. 1. As shown in FIG. 5, the memory refresh apparatus 500 may include a receiving module 502 and a refresh module 506. The memory 108 includes a plurality of ranks.

The receiving module 502 is configured to receive access requests. Specifically, the receiving module 502 may receive access requests sent by one or more cores 104 in a computer system 100. It may be understood that, the receiving module 502 may be further configured to receive data returned by the memory 108. The receiving module 502 may specifically include a communications interface between a memory controller 106 and the core 104, and a communications interface between the memory controller 106 and the memory 108.

The refresh module 506 is configured to refresh a first rank in the plurality of ranks at a T/N interval when a quantity of target ranks of access requests received within a first time period is less than a specified first threshold and a proportion of read requests or write requests in the access requests is greater than a specified second threshold, where T is used to indicate a standard average refresh interval, and N is an integer greater than 1.

In a possible case, the refresh module 506 is further configured to refresh the first rank at a T interval when a quantity of target ranks of access requests received within a second time period is not less than the specified first threshold or a proportion of read requests or write requests in the access requests is not greater than the specified second threshold.

In another possible case, the memory refresh apparatus 500 may further include a statistical module 504. The statistical module 504 is configured to collect statistics on a quantity of the received access requests. During actual application, the statistical module 504 may further collect statistics on a quantity of access requests for accessing each rank. It may be understood that, when the memory refresh apparatus 500 includes the statistical module 504, the refresh module 506 may dynamically adjust a refresh mode based on a statistical result of the statistical module 504.

In another possible case, the receiving module 502 is further configured to receive, in a process of refreshing the first rank, a first access request for accessing the first rank. The memory refresh apparatus may further include a buffer module 508. The buffer module 508 is configured to buffer the first access request in a configured buffer queue. The buffer module 508 includes at least the buffer queue and a scheduling queue. The buffer queue is configured to buffer an access request for a rank on which a refresh operation is being performed, and the scheduling queue is configured to buffer an access request to be sent to a rank on which a refresh operation is not being performed.

In another possible case, the receiving module 502 is further configured to receive a second access request for accessing a second rank in the DRAM. The buffer module 508 is configured to buffer the second access request in the scheduling queue when no refresh operation is being performed on the second rank.

In another possible case, the refresh module 506 is specifically configured to: refresh the first rank at the T/N interval when a quantity of the access requests received within the first time period is greater than a third threshold and a quantity of access requests for accessing the first rank that are in the received access requests is less than a fourth threshold, where within the first time period, the quantity of the access requests for accessing the first rank is greater than 0.

In another possible case, the refresh module 506 is specifically configured to: refresh the first rank in the plurality of ranks at the T/N interval when a quantity of access requests for accessing the first rank that are in the received access requests within the first time period is not less than a fourth threshold and a quantity of postponed refreshes on the first rank is greater than a specified fifth threshold. The fifth threshold is less than a specified warning value, and the warning value is used to indicate a need to immediately perform a refresh operation on the first rank.

In another possible case, the refresh module 506 is specifically configured to: refresh the first rank in the plurality of ranks at the T/N interval when a quantity of the access requests received within the first time period is not greater than a specified third threshold, a quantity of access requests for the first rank is greater than 0, and a quantity of postponed refreshes on the first rank is greater than a specified fifth threshold. The fifth threshold is less than a specified warning value, and the warning value is used to indicate a need to immediately perform a refresh operation on the first rank.

It may be understood that, modules in the memory refresh apparatus 500 shown in FIG. 5 may be separately located in one or more components in the memory controller shown in FIG. 2. In this embodiment of the present invention, some or all of the modules in the embodiment shown in FIG. 5 may be selected depending on an actual requirement to achieve an objective of the solution in this embodiment. For content that is not described in detail in the embodiment of FIG. 5, refer to the related description in the method embodiments shown in FIG. 3 and FIG. 4.

It may be understood that the described apparatus embodiments are merely examples. For example, the module division is merely logical function division and may be other division in actual implementation. For example, a plurality of modules or components may be combined or integrated into another system, or some features may be ignored or not performed. In addition, connections between the modules discussed in the foregoing embodiments may be in electrical, mechanical, or other forms. The modules described as separate parts may or may not be physically separate, and parts displayed as modules may or may not be physical modules. In addition, function modules in the embodiments of this application may exist independently, or may be integrated into one processing module. For example, the function modules shown in FIG. 5 may be integrated into the memory controller shown in FIG. 2.

An embodiment of the present invention further provides a computer program product for data processing, including a computer readable storage medium storing program code, where instructions included in the program code are used to execute the method process described in any one of the foregoing method embodiments. A person of ordinary skill in the art may understand that the foregoing storage medium may include any non-transitory machine-readable medium capable of storing program code, such as a USB flash drive, a removable hard disk, a magnetic disk, an optical disc, a random-access memory (RAM), a solid state disk (SSD), or a non-volatile memory.

It should be noted that the embodiments provided in this application are merely examples. A person skilled in the art may clearly know that, for convenience and conciseness of description, in the foregoing embodiments, the embodiments emphasize different aspects, and for a part not described in detail in one embodiment, reference may be made to relevant description of another embodiment. The embodiments of the present invention, claims, and features disclosed in the accompanying drawings may exist independently, or exist in a combination. Features described in a hardware form in the embodiments of the present invention may be executed by software, and vice versa, which is not limited herein.

What is claimed is:

1. A memory controller, comprising:
a communications interface for configured to receiving a first plurality of access requests sent by a processor in a computer system within a first time period; and
a refresh circuit, configured to refresh a first rank in a plurality of ranks in a dynamic random access memory (DRAM) at shortened interval set to interval when a quantity of target ranks to be accessed by the first plurality of access requests is less than a first threshold and a proportion of read requests in the first plurality of access requests or a proportion of write requests in the first plurality of access requests is greater than a second threshold, wherein each of the ranks comprising a plurality of DRAM cell, T is a standard average refresh interval, and N is greater than 1.

2. The memory controller according to claim 1, wherein the communications interface is further configured to receive a second plurality of access requests within a second time period; and
the refresh circuit is further configured to:
refresh the first rank at the standard average refresh interval when a quantity of target ranks to be accessed by the second plurality of access requests is not less than the first threshold, a proportion of read requests in the second plurality of access requests is not greater than the second threshold, or a proportion of write requests in the second plurality of access requests is not greater than the specified second threshold.

3. The memory controller according to claim 1, wherein the communications interface is further configured to receive, while refreshing the first rank, a first access request for accessing the first rank; and
the memory controller further comprises:
a buffer, comprising a buffer queue,
wherein the memory controller being configured to buffer in the buffer queue the first access request for accessing the first rank on which a refresh operation is being performed.

4. The memory controller according to claim 3, wherein the buffer further comprises a scheduling queue, and wherein
the communications interface is further configured to receive a second access request for accessing a second rank in the DRAM; and
the memory controller is further configured to buffer the second access request in the scheduling queue of the buffer when no refresh operation is being performed on the second rank.

5. The memory controller according to claim 1, wherein the refresh circuit is configured to:
refresh the first rank at the shortened interval when a quantity of the first plurality of access requests is greater than a third threshold and a quantity of access requests for accessing the first rank that are in the first plurality of access requests is less than a fourth threshold, wherein the quantity of the access requests for accessing the first rank is greater than 0.

6. The memory controller according to claim 1, wherein the refresh circuit is configured to:
refresh the first rank at the shortened interval when a quantity of access requests for accessing the first rank that are in the first plurality of access requests is not less than a fourth threshold and a quantity of postponed refreshes on the first rank is greater than a fifth threshold, wherein the fifth threshold is less than a warning value, and the warning value is configured to indicate performing a refresh operation on the first rank immediately.

* * * * *